(12) United States Patent
Chen et al.

(10) Patent No.: US 10,672,737 B2
(45) Date of Patent: *Jun. 2, 2020

(54) THREE-DIMENSIONAL INTEGRATED CIRCUIT STRUCTURE AND METHOD OF MANUFACTURING THE SAME

(71) Applicant: Taiwan Semiconductor Manufacturing Co., Ltd., Hsinchu (TW)

(72) Inventors: Yi-Hsiu Chen, Hsinchu (TW); Ebin Liao, Hsin-Chu (TW); Hong-Ye Shih, New Taipei (TW); Wen-Chih Chiou, Miaoli County (TW); Jia-Ling Ko, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/874,893

(22) Filed: Jan. 19, 2018

(65) Prior Publication Data
US 2019/0139935 A1    May 9, 2019

Related U.S. Application Data

(60) Provisional application No. 62/581,774, filed on Nov. 5, 2017.

(51) Int. Cl.
| H01L 25/065 | (2006.01) |
| H01L 21/56 | (2006.01) |
| H01L 25/00 | (2006.01) |
| H01L 23/544 | (2006.01) |
| H01L 21/822 | (2006.01) |
| H01L 23/31 | (2006.01) |

(52) U.S. Cl.
CPC .......... *H01L 25/0652* (2013.01); *H01L 21/56* (2013.01); *H01L 21/565* (2013.01); *H01L 21/8221* (2013.01); *H01L 23/544* (2013.01); *H01L 25/50* (2013.01); *H01L 23/3121* (2013.01); *H01L 2223/5446* (2013.01); *H01L 2223/54426* (2013.01); *H01L 2225/06517* (2013.01); *H01L 2225/06558* (2013.01); *H01L 2225/06582* (2013.01)

(58) Field of Classification Search
CPC ... H01L 21/02002; H01L 24/94; H01L 24/96; H01L 25/0652; H01L 21/565; H01L 25/50; H01L 2225/06558; H01L 2225/06582; H01L 21/6836
See application file for complete search history.

(56) References Cited

U.S. PATENT DOCUMENTS

| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

*Primary Examiner* — Thanh Y. Tran
(74) *Attorney, Agent, or Firm* — JCIPRNET

(57) ABSTRACT

Provided is a 3DIC structure includes a wafer, a die and a dielectric layer. The die is over and bonded to the wafer. The dielectric layer is over the wafer and aside the die, covering sidewalls of the die. A total thickness variation (TTV) of the die is less than 0.8 μm.

20 Claims, 5 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,601,410 B2* | 3/2017 | Tsai | H01L 23/481 |
| 10,269,761 B2* | 4/2019 | Tsai | H01L 23/481 |
| 2013/0168858 A1* | 7/2013 | Ramasamy | H01L 24/96 |
| | | | 257/738 |
| 2015/0294962 A1* | 10/2015 | Lin | H01L 25/50 |
| | | | 438/108 |
| 2016/0197029 A1* | 7/2016 | Tsai | H01L 23/481 |
| | | | 257/774 |

* cited by examiner

THREE-DIMENSIONAL INTEGRATED CIRCUIT STRUCTURE AND METHOD OF MANUFACTURING THE SAME

CROSS-REFERENCE TO RELATED APPLICATION

This application claims the priority benefit of U.S. provisional application Ser. No. 62/581,774, filed on Nov. 5, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

3DICs provide improved integration density and other advantages, such as faster speeds and higher bandwidth, because of the decreased length of interconnects between the stacked chips. However, there are quite a few challenges to be handled for the technology of 3DICs.

DETAILED DESCRIPTION

Figure 1A:
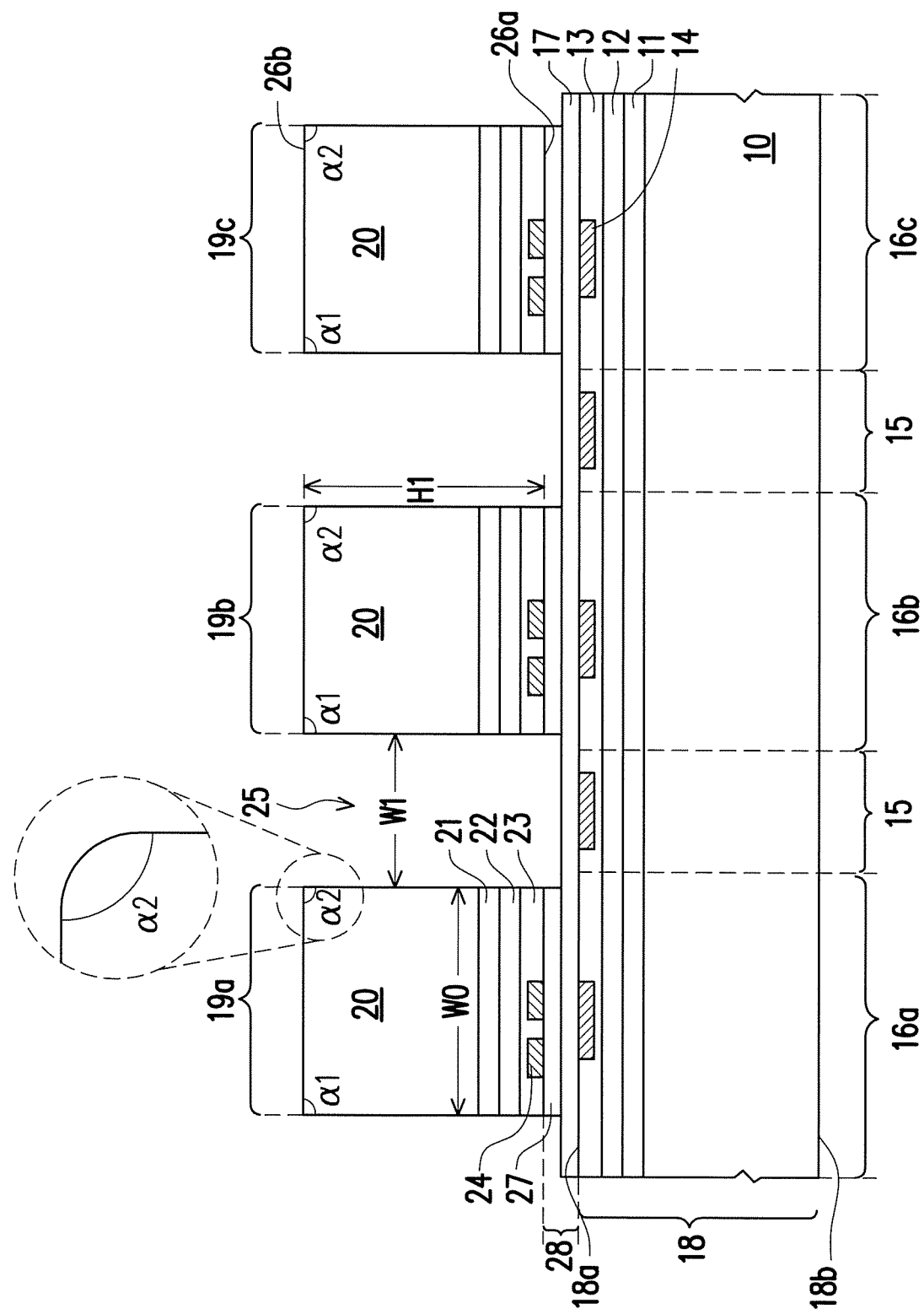
FIG. 1A to FIG. 1D are schematic cross-sectional views illustrating a method of forming a three-dimensional integrated chip (3DIC) structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views illustrating a method of forming a three-dimensional integrated chip (3DIC) structure according to some embodiments of the disclosure.

Referring to FIG. 1A, a wafer 18 including a plurality of dies 16a, 16b and 16c is provided. The dies 16a, 16b and 16c may respectively be an application-specific integrated circuit (ASIC) chip, an analog chip, a sensor chip, a wireless and radio frequency chip, a voltage regulator chip or a memory chips, for example. The dies 16a, 16b and 16c may be the same types of dies or the different types of dies. The number of the dies formed in the wafer 18 shown in FIG. 1A is merely for illustration, and the disclosure is not limited thereto. In some embodiments, the wafer 18 includes a plurality of dies arranged in an array, and the number of the dies may be adjusted according to design of products. In some embodiments, the dies 16a, 16b and 16c may be separated after a die-saw process performed on the scribe regions 15.

In some embodiments, the wafer 18 includes a substrate 10, a device layer 11, a metallization structure 12, a passivation layer 13 and a plurality of pads 14. The substrate 10 is a semiconductor substrate such as a silicon substrate. The substrate 10 is, for example, a bulk silicon substrate, a doped silicon substrate, an undoped silicon substrate, or a silicon-on-insulator (SOI) substrate. The dopant of the doped silicon substrate may be an N-type dopant, a P-type dopant or a combination thereof. The substrate 10 may also be formed by the other semiconductor materials. The other semiconductor materials include but are not limited to silicon germanium, silicon carbide, gallium arsenide, or the like. The substrate 10 includes active areas and isolation structures (not shown).

The device layer 11 includes a wide variety of devices (not shown) formed on the active areas of the substrate 10. In some embodiments, the devices include active components, passive components, or a combination thereof. In some embodiments, the devices include integrated circuit devices, for example. The devices are, for example, transistors, capacitors, resistors, diodes, photodiodes, fuse devices, or other similar devices. That is to say, the wafer 18 is a wafer with devices framed in it, instead of a carrier. The metallization structure 12 is formed over the substrate 10 and the device layer 11. In some embodiments, the metallization structure 12 includes one or more dielectric layers and interconnection structures formed therein (not shown).

The interconnection structures include multiple layers of contacts, conductive lines and plugs, and are electrically connected to the devices in the device layer 11. In some embodiments, the interconnection structures may also be formed in the scribe regions 15.

The pads 14 are formed over the metallization structure 12. The pads 14 are electrically connected to the interconnection structure in the metallization structure 12, so as to provide an external connection of the devices in the device layer 11. The material of the pads 14 may include metal or metal alloy, such as aluminum, copper, nickel, or alloys thereof. In some embodiments, the pad 14 in the scribe region 15 may serve as a mark such as an alignment mark or an overlay mark of a test key structure aside the dies 16a, 16b or 16c.

The passivation layer 13 is formed over metallization structure 12 to cover the sidewalls of the pads 14. The passivation layer 13 may be a single layer structure or a multilayer structure. In some embodiments, the passivation layer 13 is also referred as a dielectric layer. The passivation layer 13 includes an insulating material such as silicon oxide, silicon nitride, low-k dielectric material such as carbon doped oxides, extremely low-k dielectric material such as porous carbon doped silicon dioxide, polymer, or a combination thereof. The polymer is, for instance, polybenzoxazole (PBO), polyimide, benzocyclobutene (BCB), a combination thereof, or the like. In some embodiments, the top surface of the passivation layer 13 is substantially level with the top surface of the pads 14. The top surface of the passivation layer 13 and the top surface of the pads 14 form an active surface of the wafer 18. In some embodiments, the active surface of the wafer 18 is also referred as a first surface 18a (or referred as front surface) of the wafer 18. The bottom surface opposite to the first surface 18a is a second surface 18b (or referred as back surface) of the wafer 18.

In other words, the die 16a, 16b or 16c respectively includes the substrate 10, the device layer 11, the metallization structure 12, the passivation layer 13, and the pads 14. The pads 14 are electrically connected to the integrated circuit devices formed on the substrate 10 through the interconnection structure of the metallization structure 12.

Still referring to FIG. 1A, a plurality of dies 19a, 19b and 19c are bonded to the wafer 18 through a bonding structure 28, for example. In some embodiments, the dies 19a, 19b and 19c respectively include an active component, or a passive component. In some embodiments, the dies 19a, 19b and 19c may respectively be an application-specific integrated circuit (ASIC) chip, an analog chip, a sensor chip, a wireless and radio frequency chip, a voltage regulator chip or a memory chips, for example. The dies 19a, 19b, and 19c may be the same types of dies or the different types of dies.

In some embodiments, the dies 19a, 19b and 19c respectively includes a substrate 20, a device layer 21, a metallization structure 22, a passivation layer 23 and a plurality of pads 24. In some embodiments, the materials and the structural characteristics of the substrate 20, the device layer 21, the metallization structure 22, the passivation layer 23 and the pads 24 are similar to or different from those of the substrate 10, the device layer 11, the metallization structure 12, the passivation layer 13 and the pads 14, respectively.

In some embodiments, the dies 19a, 19b and 19c are dies cut from a wafer or a plurality of wafers by die-saw processes. That is, the dies 19a, 19b and 19c may be cut from a same wafer or different wafers. Before the dies 19a, 19b and 19c are singulated, a polishing process may be performed for thinning the wafer. Thereafter, the dies 19a, 19b and 19c are bonded to the wafer 18.

The dies 19a, 19b and 19c may have the same size or different sizes. In some embodiments in which the dies 19a, 19b and 19c have the same size, the top surfaces of the dies 19a, 19b and 19c are substantially level with each other. In some embodiments, a plurality of gaps 25 are existed between the dies 19a, 19b, and 19c. That is to say, the dies 19a, 19b and 19c are discretely located on the wafer 18. The width W1 of the gap 25, that is, the distance between the adjacent dies 19a and 19b, or 19b and 19c, ranges from 30 µm to 1000 µm.

The dies 19a, 19b, and 19c respectively have a first surface 26a and a second surface 26b opposite to each other. In some embodiments, the first surface 26a is an active surface (or referred as a front surface) of the die 19a, 19b or 19c including a surface of the passivation layer 23 and a surface of the pads 24. The second surface 26b is also referred as a back surface of the die 19a, 19b, or 19c.

Still referring to FIG. 1A, the bonding structure 28 includes a bonding layer 17 and a plurality of bonding layers 27. In some embodiments, the bonding layer 17 is formed on the first surface 18a of the wafer 18. The bonding layers 27 are formed on the first surfaces 26a of the dies 19a, 19b and 19c.

In some embodiments, the bonding layer 17 and the bonding layer 27 respectively includes a dielectric material. In some other embodiments, the bonding layer 17 and the bonding layer 27 respectively includes a dielectric material and a conductive material embedded in the dielectric material. The materials of the bonding layer 17 and the bonding layers 27 may be the same or different. The dielectric material includes oxide such as silicon oxide, nitride such as silicon nitride, oxynitride such as silicon oxynitride, polymer, or a combination thereof. The polymer includes PBO, polyimide, BCB, a combination thereof, or the like, for example. The conductive material may include metal, metal alloy, or a combination thereof. In some embodiments, the conductive material is, for instance, copper, nickel, aluminum, tungsten, alloys thereof, or a combination thereof.

In some embodiments in which the bonding layer 17 and 27 include a dielectric material, the forming method thereof include a deposition process such as a chemical vapor (CVD) deposition process. In some embodiments in which the bonding layer 17 and 27 include a dielectric material and a conductive material, the forming method thereof further includes forming one or more openings in the dielectric material, and then forming the conductive material in the opening by, for example, a physical vapor deposition (PVD) process, or a plating process, or the like. In some embodiments, the surface of the dielectric material and the surface of the conductive material are substantially coplanar with each other.

In some embodiments, the dies 19a, 19b and 19c are respectively aligned with the dies 16a, 16b and 16c. The bonding layers 27 on the first surface 26a of the dies 19a, 19b and 19c are bonded to the bonding layer 17 on the first surface 18a of the wafer 18, and form a bonding structure 28 between the wafer and the dies 19a, 19b and 19c. In other words, the dies 19a/19b/19c and the wafer 18 are configured as face to face. In some embodiments, the bonding layers 27 are bonded to the bonding layer 17 by a hybrid bonding process, a fusion bonding process, or a combination thereof.

In some embodiments in which the bonding layer 27 and the bonding layer 17 include dielectric material, the bonding structure 28 includes a fusion bonding. The bonding operation of fusion bonding may be performed as follows. First, to avoid the occurrence of the unbonded areas (i.e. interface bubbles), the to-be-bonded surfaces of the bonding layer 17 (that is, the top surface of the bonding layer 17) and the bonding layer 27 (that is, the bottom surface of the bonding layer 27) are processed to be sufficiently clean and smooth. Then, the dies 19a, 19b, and 19c having the bonding layer 27 and the dies 16a, 16b and 16c of the wafer 18 having the bonding layer 17 are aligned and placed in physical contact at room temperature with slight pressure to initiate a bonding operation. Thereafter, an annealing process at elevated temperatures is performed to strengthen the chemical bonds between the to-be-bonded surfaces of the bonding layer 17 and the bonding layer 27 and to transform the chemical bonds into covalent bonds.

In some embodiments in which the bonding layer 17 and the bonding layer 27 include the dielectric material and the conductive material, the bonding structure 28 includes a hybrid bonding, the hybrid bonding involves at least two types of bonding, including metal-to-metal bonding and non-metal-to-non-metal bonding such as dielectric-to-dielectric bonding. That is to say, the conductive material and the conductive material are bonded by metal-to-metal bonding, the dielectric material and the dielectric material are bonded by dielectric-to-dielectric bonding.

In some other embodiments, the dies 19a, 19b and 19c may be bonded to the wafer 18 without the bonding structure 28 therebetween. The dies 19a, 19b and 19c are aligned with the dies 16a, 16b and 16c, respectively. The pads 24 are aligned with the pads 14, the passivation layers 23 are aligned with the passivation layer 13. Thereafter, the pads 24 and the passivation layers 23 of the dies 19a, 19b and 19c are bonded to the pads 14 and the passivation layer 13 of the wafer 18 by a suitable bonding method such as a hybrid bonding, a fusion bonding, or a combination thereof.

In some other embodiments, the dies 19a, 19b and 19c may be bonded to the wafer 18 though a plurality of connectors (not shown), and an underfill layer may be formed to fill the space between the dies 19a, 19b, 19c and the wafer 18, and surround the connectors. The connectors are located between the pads 14 and the pads 24 to electrically connect the dies 19a, 19b, and 19c, and the wafer 18. The connector may be conductive bumps such as solder bumps, silver balls, copper balls, gold bumps, copper bumps, copper posts, or any other suitable metallic bumps or the like.

In some embodiments, as shown in FIG. 1A, one die 19a, 19b or 19c is respectively bonded to one die 16a, 16b or 16c of the wafer 18, but the disclosure is not limited thereto. In some other embodiments, two or more dies may be bonded to one die 16a, 16b or 16c of the wafer 18 (not shown).

In some embodiments, after the dies 19a, 19b and 19c are bonded to the wafer 18, a grinding process is performed for further thinning the dies 19a, 19b and 19c. During the grinding process, the dies 19a, 19b and 19c are thinned. In some embodiments, after the grinding process is performed, the height H1 (or referred as thickness) of the die 19a, 19b or 19c ranges from 5 µm to 750 µm. In an exemplary embodiment, the height H1 is 15 µm, for example. The width W0 of the die 19a, 19b or 19c ranges from 1 min to 30 mm.

Referring to the enlarged view of the corner α2 of the die 19a, 19b or 19c shown in FIG. 1A, in some embodiments, the top corners α1 and α2 are slighted damaged and being rounded after the grinding process is performed.

Figure 1B:
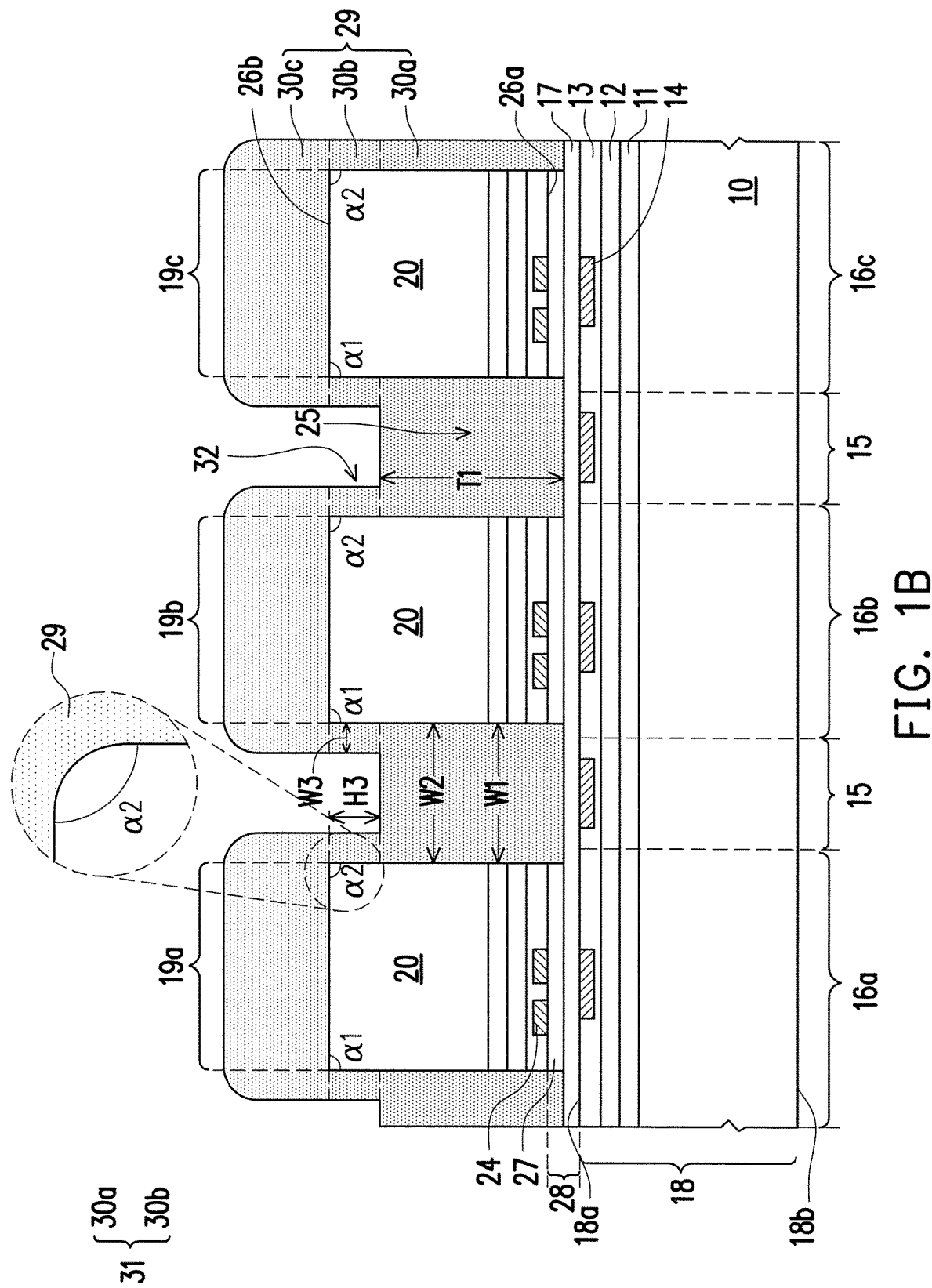

Referring to FIG. 1B, a dielectric layer 29 is then formed over the wafer 18 and on the dies 19a, 19b and 19c. The dielectric layer 29 may be a single layer structure or a multi-layer structure. In some embodiments, the material of the dielectric layer 29 includes an inorganic dielectric material, an organic dielectric material, or a combination thereof. The inorganic dielectric material includes oxide such as silicon oxide, nitride such as silicon nitride, oxynitride such as silicon oxynitride, silicon carbonitride (SiCN), silicon carbon oxide (SiCO), or a combination thereof. The organic dielectric material includes polymer such as polybenzoxazole (PBO), polyimide, benzocyclobutene (BCB), epoxy, a combination thereof, or the like. The forming method of the dielectric layer 29 includes a deposition process such as chemical vapor deposition (CVD), plasma-enhanced chemical vapor deposition (PECVD), or the like.

Still referring to FIG. 1B, the dielectric layer 29 covers the second surfaces 26b, the sidewalls of the dies 19a, 19b and 19c, and the sidewalls of the bonding layer 27, and the top surface of the bonding layer 17. That is to say, the gaps 25 between the dies 19a, 19b, and 19c are filled with the dielectric layer 29, and the dielectric layer 29 is also referred as a gap-fill dielectric layer.

In some embodiments, the dielectric layer 29 includes a gap fill structure 31 in the gaps 25 and a plurality of protrusions 30c on the tops of the dies 19a, 19b and 19c. The gap fill structure 31 includes a first part 30a and a plurality of second parts 30b, and the protrusion 30c is a third part 30c. Specifically, the dielectric layer 29 includes the first part 30a, the second parts 30b and the third parts 30c from bottom to top. The first part 30a and the second parts 30b are located in the gaps 25 between the dies 19a, 19b and 19c, so as to surround and cover sidewalls of the dies 19a, 19b and 19c. The third parts 30c (or referred as protrusions 30c) are located on the dies 19a, 19c and 19c and the second parts 30b, so as to cover the top surfaces of the dies 19a, 19b and 19c. The details are described as below.

The first part 30a is located on the bonding layer 17 and in the gaps 25. The width W2 of the first part 30a is substantially the same as the width W1 of the gap 25. In some embodiments, the top surface of the first part 30a is lower than the second surface 26b of the die 19a, 19b or 19c. That is to say, the top surface of the dielectric layer 29 between the dies 19a, 19b and 19c is lower than the second surfaces 26b of the dies 19a, 19b and 19c. In some embodiments, the thickness T1 of the first part 30a ranges from 5 µm to 750 µm. In some embodiments, the height difference H3 between the second surface 26b of the die 19a, 19b or 19c and the top surface of the first part 30a (that is, the height of second part 30b) ranges from 0.1 µm to 740 µm.

The second parts 30b are located on the first part 30a and cover upper portions of the sidewalls of the die 19a, 19b or 19c. Specifically, in some embodiments, the second parts 30b are located on the edge of the first part, surrounding and covering upper portions of sidewalls of the dies 19a, 19b and 19c. The second parts 30b at least cover a portion of the top surface of the first part 30a. The top surfaces of the second parts 30b are level with the second surfaces 26b of the dies 19a, 19b and 19c. In some embodiments, the width W3 of the second part 30b ranges from 15 µm to 500 µm. In some embodiments, the ratio of the width W3 to the width W2 ranges from 0.015 to 0.5. That is to say, in some embodiments, the gap 25 may be filled up with the dielectric layer 29.

The first part 30a and the second part 30b form the gap fill structure 31 located in the gaps 25. In some embodiments, the cross-section shape of the gap fill structure 31 may be square, rectangle, or U-shaped, but the disclosure is not limited thereto. In some embodiments in which the cross-section shape of the gap fill structure 31 is U-shaped, the gap fill structure 31 has a recess 32 on the first part 30a and between the second parts 30b. The bottom surface of the recess 32 is the top surface of the first part 30a. The sidewall of the recess 32 is formed of the sidewall of the second part 30b. The recess 32 is within the gap 25, and the depth of the recess 32 equals to the height difference H3 or the height of the second part 30b. That is to say, in some embodiments, the gap 25 is mostly filled with the dielectric layer 29, except an upper portion of the gap 25 is not filled with the dielectric layer 29.

The third parts 30c are located on the dies 19a, 19b and 19c and the second parts 30b, covering the second surfaces 26b of the dies 19a, 19b and 19c and the second parts 30b. The width of the third part 30c is larger than the width W0 of the die 19a, 19b or 19c. In some embodiments, the value of the difference between the width of the third part 30c and the width W0 of the die 19a, 19b or 19c equals to the sum of the widths (W3*2) of the second parts 30b on opposite sidewalls of the die 19a, 19b or 19c.

Referring to the enlarged view of the top corner α2 of the die 19a, 19b or 19c, the top cornerα2 are covered by the dielectric layer 29.

Figure 1C:
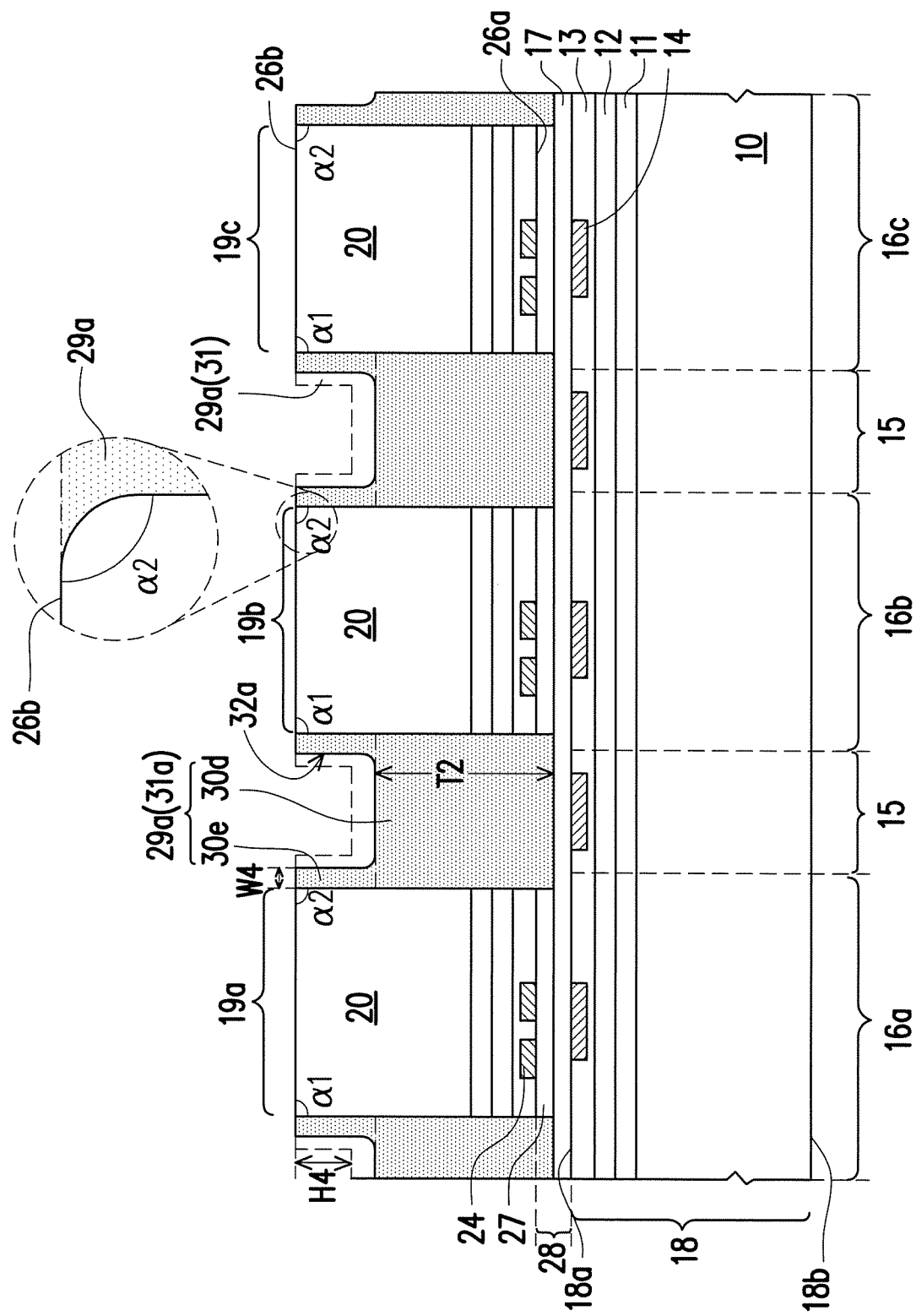

Referring to FIG. 1B and FIG. 1C, a portion of the dielectric layer 29 is removed, such that the second surfaces 26b of the die 19a, 19b and 19c are exposed. The removal method includes a first planarization process such as a chemical mechanical polishing (CMP) process. The slurry used in the planarization process may have a high selectivity ratio of the dielectric layer 29 to the substrate 20 of the die 19a, 19b or 19c. In some embodiments, the selectivity ratio of the dielectric layer 29 to the substrate 20 is greater than 4. In some embodiments, the selectivity ratio ranges from 1 to 100. In some embodiments, the polishing rate of the first planarization process ranges from 0.5 μm/min to 3 μm/min.

In some embodiments, as shown in the dotted line in FIG. 1C, the third parts 30c of the dielectric layer 29 are removed, and the gap fill structure 31 of the dielectric layer 29 is not removed during the first planarization process, and the gap fill structure 31 remained form a dielectric layer 29a.

Referring to FIG. 1B and FIG. 1C, in some other embodiments, the third parts 30c and a portion of the gap fill structure 31 of the dielectric layer 29 are removed during the first planarization process, and a dielectric layer 29a including a gap fill structure 31a is formed, and the gap fill structure 31a has a recess 32a.

In some embodiments, the size of the recess 32a is slightly larger than the size of the recess 32. Herein, the term "size" refers to width or depth, or a combination thereof. In some embodiments, the recess 32a is wider and deeper than the recess 32. That is to say, a portion of the first part 30a and portions of the second parts 30b are removed during the planarization process, and a first part 30d and a second part 30e are remained to form the dielectric layer 29a (the gap fill structure 31a). In some embodiments, the thickness T2 of the first part 30d is less than the thickness T1 of the first part 30a (shown in FIG. 1B). That is, the height difference H4 between the second surface 26b of the die 19a, 19b or 19c and the top surface of the first part 30e is greater than the height difference H3 (shown in FIG. 1B).

Still referring to FIG. 1B and FIG. 1C, in some embodiments, the second part 30e is thinner and higher than the second part 30b. The width W4 of the second part 30e is less than the width W3 of the second part 30b (shown in FIG. 1B). The height of the second part 30e (equals to the height difference H4) is larger than the height of the second part 30b (equals to the height difference H3). In some embodiments, the top surface of the second part 30e (that is, the top surface of the dielectric layer 29a) is coplanar with the second surfaces 26b of the dies 19a, 19b and 19c.

Referring to the enlarged view of the top corners α1 and α2 showing in FIG. 1C, after the planarization process, the rounded part of the top corners α1 and α2 are still covered by the dielectric layer 29a, and the top surface of the dielectric layer 29a is coplanar with the second surfaces 26b of the dies 19a, 19b and 19c.

Figure 1D:
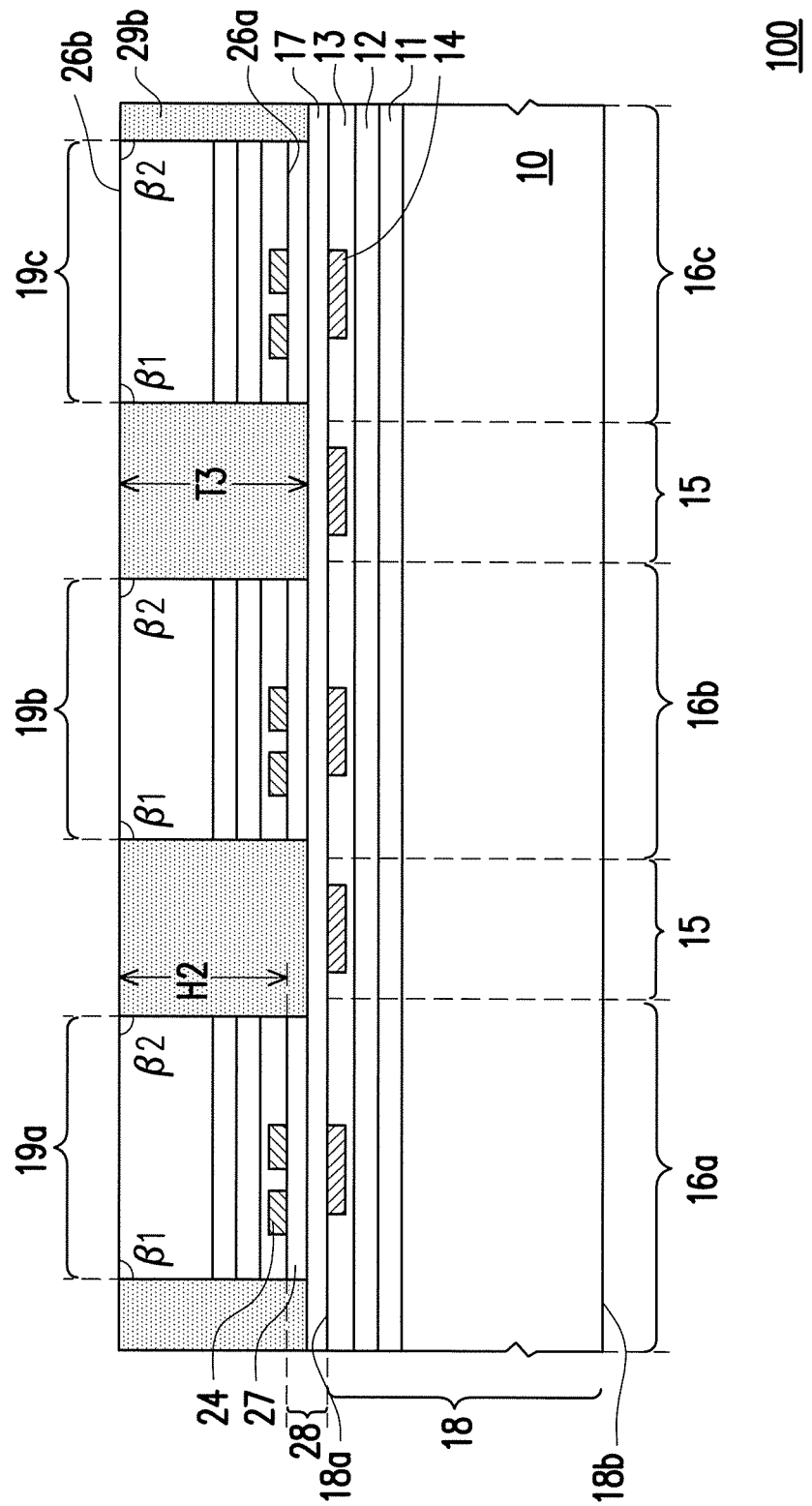

Referring to FIG. 1C and FIG. 1D, a portion of the dielectric layer 29a and portions of the dies 19a, 19b and 19c are removed, such that a dielectric layer 29b is formed, and the height of the die 19a, 19b or 19c is reduced from H1 to H2. In some embodiments, the height H2 ranges from 4 μm to 749 μm. In the exemplary embodiment in which the height H1 is 15 μm, the height H2 is 10 μm. The removal method includes a second planarization process, such as a CMP process. The slurry used in the planarization process may have a high selectivity ratio of the substrate 20 of the die 19a, 19b or 19c to the dielectric layer 29a. In some embodiments, the selectivity ratio ranges from 1 to 10. In some embodiments, the polishing rate of the second planarization process ranges from 0.4 gm/min to 1.5 μm/min. Referring to FIG. 1D, the dielectric layer 29b is over the wafer 18 and aside the dies 19a, 19b and 19c to cover the sidewalls of the dies 19a, 19b and 19c. In some embodiments, the top surface of the dielectric layer 29b is substantially coplanar with the second surfaces 26b of the dies 19a, 19b and 19c. A 3DIC structure 100 is thus completed.

Still referring to FIG. 1D, the dies 19a, 19b and 19c respectively has a top corner β1 and a top corner β2 opposite to each other. In some embodiments, the rounded part the top corners α1 and α2 are completed removed during the planarization process, and the top corners β1 and β2 are right angle, that is, equal to 90°. In some embodiments, most of the rounded part of the top corners α1 and α2 are removed, and a tiny portion of the rounded part is remained in top corners β1 and β2. In some embodiments, the top corner β1 and the top corner β2 are symmetrical or asymmetrical.

Figure 2:
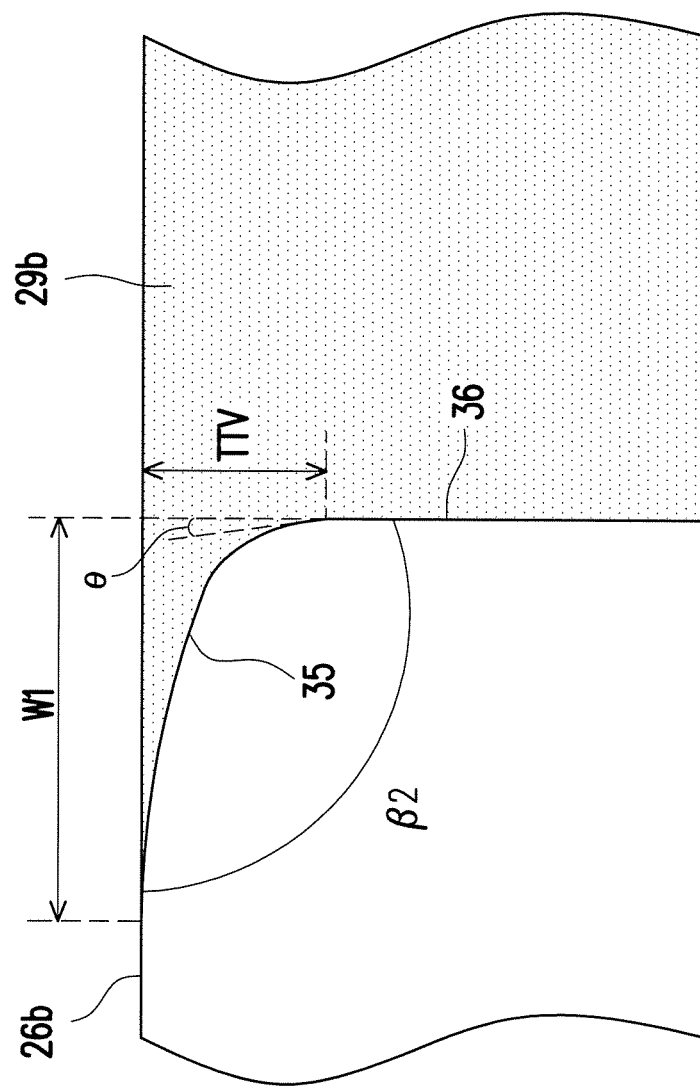
FIG. 2 is an enlarged view of a top corner of a die of a three-dimensional integrated chip (3DIC) structure according to some embodiments of the disclosure.

FIG. 2 is an enlarged view of the top corner β2, for the sake of brevity, one top corner is shown in FIG. 2. Referring to FIG. 2, the top corner β2 includes a rounded part 35. The rounded part 35 connects to the sidewall 36 and the second surface 26b of the die 19a, 19b or 19c. The sidewall 36 and the rounded part 35 are covered by the dielectric layer 29b. In some embodiment, an included angle θ between the rounded part 35 and an extension of the sidewall of the die 19a, 19b or 19c (shown in dotted line) is less than 15°. In some embodiments in which the top corner β2 is a right angle, the included angle θ is 0°. That is to say, the included angle θ is greater than or equal to 0°, and less than 15°.

Still referring to FIG. 2, in some embodiments, a total thickness variation TTV of the die 19a, 19b or 19c is greater than or equal to 0 μm, and less than 0.8 μm. The width W10 of the rounded part is greater than or equal to 0 μm, and less than 50 μm. The farther away from the sidewall of the die, the smaller the thickness variation of the rounder part. In some embodiments, a total thickness variation within wafer is less than 50 μm.

In some embodiments of the disclosure, after the 3DIC structure is formed, subsequent processes may be performed to stack more layers of dies or devices on the 3DIC structure, so as to form a multi-layer stacked chip-on-wafer structure. Vias such as through silicon vias (TSVs), through insulator vias (TIVs), through dielectric vias (TDVs), or the like, or a combination thereof may be formed to electrical connect the dies or devices on the 3DIC structure to the dies 19a/19b/19c and the wafer 18. In some embodiments, after the multi-layer stacked chip-on-wafer structure is formed, a die saw process is performed to singulate the stacked structure.

In the embodiments of the disclosure, the dies 19a, 19b and 19c are thinned during the grinding process and the second planarization process. During the grinding process, a great amount of the die 19a/19b/19c is removed, and the die 19a/19b/19c is greatly thinned. During the second planarization process, a small amount of the die 19a/19b/19c is removed, and the die 19a/19b/19c is slighted thinned. That is to say, the thickness of the die 19a/19b/19c reduced in the grinding process is much greater than that in the second planarization process.

On the other hand, between the grinding process and the step of forming the dielectric layer, no planarization process is performed in some embodiments. Both the first and the second planarization process are performed after the dielectric layer is formed. Therefore, the top corners of the die are covered and protected by the dielectric layer during the first and the second planarization processes. During the second planarization process, the top corner is covered by the dielectric layer, and the slurry used in the second planarization process has a high selectivity ratio of the substrate of the die to the dielectric layer, therefore, the dielectric layer on the top corner may protect and be used as a hard mask of the top corner of the die. As a result, after the first and second planarization process is performed, the rounding issue may occurred during the grinding process is reduced or eliminated. The TTV of the die is also reduced.

In accordance with some embodiments of the disclosure, a method of manufacturing a three-dimensional integrated circuit (3DIC) structure includes the following steps. A die is bonded to a wafer. A dielectric layer is formed on the wafer and the die, so as to cover a top surface, top corners and sidewalls of the die. A portion of the dielectric layer covering the top surface of the die is removed. A portion of the die and another portion of the dielectric layer are removed.

In accordance with alternative embodiments of the disclosure, a method of manufacturing a 3DIC structure includes the following steps. A plurality of dies are bonded to a wafer. A dielectric layer is formed on the wafer and the dies, so as to cover top surfaces and sidewalls of the dies, wherein a top surface of the dielectric layer between the dies is lower than top surfaces of the dies. A first planarization process is performed to remove a portion of the dielectric layer, so as to expose the top surfaces of the dies. A second planarization process is performed to remove another portion of the dielectric layer and portions of the dies. Top corners of the dies are covered by the dielectric layer during the first planarization process and the second planarization process.

In accordance with some embodiments of the disclosure, a 3DIC structure includes a wafer, a die and a dielectric layer. The die is over and bonded to the wafer. The dielectric layer is over the wafer and aside the die, covering sidewalls of the die. A total thickness variation (TTV) of the die is less than 0.8 μm.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a three-dimensional integrated circuit (3DIC) structure, comprising:
    bonding a die to a wafer, wherein the die has a first total thickness variation (TTV);
    forming a dielectric layer on the wafer and the die, so as to cover a top surface, top corners and sidewalls of the die, wherein the dielectric layer comprises a gap fill structure and a protrusion connected to each other, the gap fill structure is laterally aside the die to cover the sidewalls of the die, and the protrusion is located on the die to cover the top surface of the die and a portion of the gap fill structure, wherein the gap fill structure has a recess, and a bottom surface of the recess is a top surface of the gap fill structure, and is lower than the top surface of the die;
    removing a portion of the dielectric layer covering the top surface of the die; and
    removing a portion of the die and another portion of the dielectric layer, wherein after the portion of the die is removed, the die has a second TTV, and the second TTV is less than the first TTV.

2. The method of claim 1, wherein the die is bonded to the wafer though a bonding structure.

3. The method of claim 2, wherein removing the portion of the die comprises removing portions of the top corners of the die.

4. The method of claim 1, wherein the portion of the dielectric layer covering the top surface of the die is removed by a first planarization process, the first planarization process comprises a first CMP process.

5. The method of claim 4, wherein the portion of the die and another portion of the dielectric layer is removed by a second planarization process, and the second planarization process comprises a second CMP process.

6. The method of claim 5, wherein the top corners of the die are covered and protected by the dielectric layer during the first planarization process.

7. The method of claim 6, wherein after the second planarization process is performed, a top surface of the dielectric layer is substantially level with a top surface of the die.

8. The method of claim 5, wherein the top corners of the die are laterally covered and protected by the dielectric layer during the second planarization process.

9. The method of claim 8, wherein the first planarization process uses a slurry having a selectivity ratio of the dielectric layer to a substrate of the die, and the selectivity ratio ranges from 1 to 100.

10. The method of claim 8, wherein the second planarization process uses a slurry having a selectivity ratio of a substrate of the die to the dielectric layer, and the selectivity ratio ranges from 1 to 10.

11. A method of manufacturing a 3DIC structure, comprising:
    bonding a plurality of dies to a wafer;
    forming a dielectric layer on the wafer and the dies, covering top surfaces and sidewalls of the dies, wherein a top surface of the dielectric layer between the dies is lower than the top surfaces of the dies, wherein the dielectric layer comprises:
        a gap fill structure, located in gaps between the dies to cover the sidewalls of the dies, wherein the gap fill structure has a recess, and a bottom surface of the recess is the top surface of the dielectric layer between the dies; and a plurality of protrusions connecting to the gap fill structure, wherein the plurality of the protrusions are respectively located on the plurality of the dies, and cover the top surfaces of the plurality of the dies and a portion of the gap fill structure;

performing a first planarization process to remove a portion of the dielectric layer, so as to expose the top surfaces of the dies; and performing a second planarization process to remove another portion of the dielectric layer and portions of the dies, wherein top corners of the dies are covered by the dielectric layer during the first planarization process, and rounded parts of the top corners of the dies are removed by the second planarization process.

12. The method of claim 11, wherein the plurality of the protrusions are removed by the first planarization process.

13. The method of claim 12, wherein a portion of the gap fill structure is removed by the second planarization process.

14. The method of claim 12, wherein a portion of the gap fill structure is further removed by the first planarization process.

15. The method of claim 14, wherein another portion of the gap fill structure is removed by the second planarization process.

16. A method of manufacturing a three-dimensional integrated circuit (3DIC) structure, comprising:

bonding a die to a wafer, wherein the die comprises a top corner having a rounded part;

forming a dielectric layer on the wafer and the die, so as to cover a top surface, the top corner and sidewalls of the die, wherein the dielectric layer comprises a gap fill structure and a protrusion connected to each other, the gap fill structure is laterally aside the die to cover the sidewalls of the die, and the protrusion is located on the die to cover the top surface of the die and a portion of the gap fill structure, wherein a top surface of the gap fill structure is lower than the top surface of the die;

performing a first removal process to remove the protrusion of the dielectric layer; and performing a second removal process to remove a portion of the die and a portion of the gap fill structure of the dielectric layer, wherein the rounded part of the top corner of the die is removed by the second removal process, and after the performing the second removal process, a total thickness variation of the die is reduced.

17. The method of claim 16, wherein after the performing the second removal process, the total thickness variation of the die is less than 0.8 μm.

18. The method of claim 16, wherein the first removal process further removes a portion of the gap fill structure.

19. The method of claim 16, further comprising performing a grinding process after the bonding the die to the wafer and before the forming the dielectric layer to thin the die.

20. The method of claim 19, wherein the rounded part of the top corner is formed during the grinding process.

* * * * *